United States Patent
Natarajan et al.

(10) Patent No.: US 8,438,001 B2
(45) Date of Patent: May 7, 2013

(54) METHOD AND APPARATUS FOR IMPROVING NOISE ANALYSIS PERFORMANCE

(75) Inventors: Anita Natarajan, South Burlington, VT (US); Ronald D. Rose, Essex Junction, VT (US); Sanjay Upreti, Lexington, KY (US)

(73) Assignee: International Business Machines Corporation, Armonk, NY (US)

( * ) Notice: Subject to any disclaimer, the term of this patent is extended or adjusted under 35 U.S.C. 154(b) by 1400 days.

(21) Appl. No.: 12/116,248

(22) Filed: May 7, 2008

(65) Prior Publication Data

US 2009/0281750 A1    Nov. 12, 2009

(51) Int. Cl.
G06F 17/50 (2006.01)

(52) U.S. Cl.
USPC ............................................ 703/14; 716/115

(58) Field of Classification Search .................... 703/13, 703/14; 702/69; 716/115
See application file for complete search history.

(56) References Cited

U.S. PATENT DOCUMENTS

| | | | |
|---|---|---|---|
| 6,029,117 A * | 2/2000 | Devgan ........................... | 702/58 |
| 6,665,845 B1 | 12/2003 | Aingaran et al. | |
| 7,181,716 B1 * | 2/2007 | Dahroug ....................... | 716/115 |
| 2002/0022951 A1 * | 2/2002 | Heijningen et al. ............ | 703/16 |

OTHER PUBLICATIONS

Charbon, E.; Miliozzi, P.; Carloni, L.P.; Ferrari, A.; Sangiovanni-Vincentelli, A.; , "Modeling digital substrate noise injection in mixed-signal IC's," Computer-Aided Design of Integrated Circuits and Systems, IEEE Transactions on , vol. 18, No. 3, pp. 301-310, Mar. 1999.*

Zhu, Q.K.; Lingareddy, M.; , "Low-Vt devices replacement for domino circuits," Microelectronics, 2002. MIEL 2002. 23rd International Conference on , vol. 2, no., pp. 597-600, 2002.*

Shepard, K.L. et al., "Harmony: Static Noise Analysis of Deep Submicron Digital Integrated Circuits", IEEE Trans. Computer-Aided Design, vol. 18, pp. 1132-1150, Aug. 1999 (Abstract only).

Calhoun, B.H. et al., "Analyzing static noise margin for sub-threshold SRAM in 65nm CMOS", Solid-State Circuits Conference 2005, ESSCIRC 2005, Proceedings of the 31$^{st}$ European Sep. 12-16, 2005, pp. 363-366.

Charbon, E. et al., "Modeling digital substrate noise injection in mixed-signal IC's", Computer-Aided Design of Integrated Circuits and Systems, IEEE Transactions on vol. 18, Issue 3, Mar. 1999, pp. 301-310 (Abstract only).

* cited by examiner

*Primary Examiner* — Kamini S Shah
*Assistant Examiner* — Luke Osborne
(74) *Attorney, Agent, or Firm* — Richard Kotulak; Roberts Mlotkowski Safran & Cole, P.C.

(57) ABSTRACT

Method and apparatus for improving performance of noise analysis using a threshold based combination of noise estimation and simulation. The method includes classifying a circuit into one of four defined groups, determining if an input noise is small enough to skip simulation, estimating an output noise wave, scaling down a generated wave by a scaling factor depending on the circuit type, and determining if the estimated output noise is small enough to propagate or instead requires simulation.

22 Claims, 1 Drawing Sheet

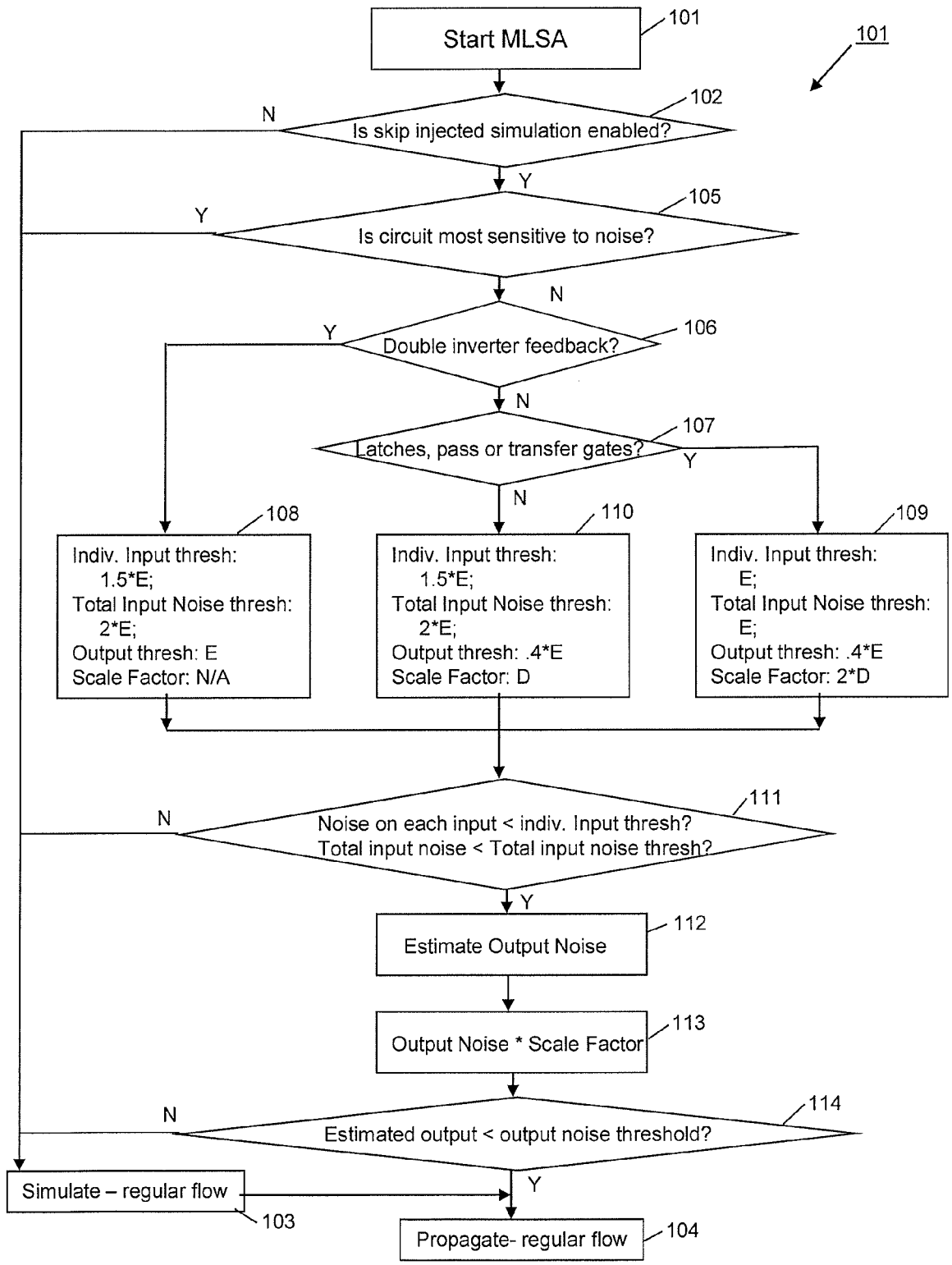

METHOD AND APPARATUS FOR IMPROVING NOISE ANALYSIS PERFORMANCE

FIELD OF THE INVENTION

The invention is directed to a process and apparatus for analyzing noise, e.g., injected noise, in sub-circuits of a larger circuit.

BACKGROUND

Transistor level static noise analysis is extremely important, considering the technology scaling and performance demands of digital design. A known process divides the circuit under test into a set of sub-circuits, called "evaluation nodes" or "channel connected components" (CCC). Each evaluation node is separately analyzed for its ability to respond in the presence of capacitive coupling, charge-sharing, power supply noise, and injected noise.

As is generally known, injected noise is unintended voltage fluctuations that propagate to a sub-circuit's inputs and are subsequently propagated through the sub-circuit. Injected noise analysis is a significant piece of static analysis of the entire circuit that requires an in-situ simulation of the sub-circuit and patterns that precondition it for a worst-case response to noise. These simulations of the various possible input sensitizations can consume 35 to 45% of the total runtime and can cause the overall noise analysis process to take up to several days on large circuits. As time to market is a key consideration in this industry, design efficiency is extremely critical.

A known static noise analysis, e.g., macro level signal analysis (MLSA), relies on the simulation of each evaluation node or channel-connected-component (CCC) of a larger circuit to characterize the noise that propagates through a circuit when its inputs are stimulated with input noise voltage waveforms. These simulations are called injected-noise simulations. Other types of noise to be analyzed can include coupling noise; charge sharing noise; and power supply noise.

Accordingly, there exists a need in the art to overcome the deficiencies and limitations described hereinabove.

SUMMARY

In embodiments, the invention relates to a method for improving performance of noise analysis using a threshold based combination of noise estimation and simulation. The method includes classifying a circuit into one of four defined groups, determining if an input noise is small enough to skip simulation, estimating an output noise wave, scaling down a generated wave by a scaling factor depending on the circuit type, and determining if the estimated output noise is small enough to propagate or instead requires simulation.

In further embodiments, the invention relates to a method for performing noise analysis on a circuit. The method includes determining whether input noise is smaller than a statistically predetermined threshold, determining whether the circuit is a predetermined noise-sensitive circuit, and, when the input noise is lower than the predetermined threshold and the circuit is not a predetermined noise-sensitive circuit, estimating an output noise for the circuit.

In still further embodiments, the invention relates to an apparatus for determining whether to estimate or simulate noise for a circuit under test. The apparatus includes a device for determining whether the circuit under test is of a type that is sensitive in the presence of noise, a device for comparing at least one of a total input noise and an injected input noise to a respective at least one of a total input noise threshold and an injected input noise threshold, and a device for comparing an estimated output noise to an output noise threshold. When the estimated output noise is lower than the output noise threshold, a device for estimating output noise is activatable.

BRIEF DESCRIPTION OF THE DRAWING

The present invention is described in the detailed description which follows, in reference to the noted drawing by way of non-limiting examples of an exemplary embodiment of the present invention.

The FIGURE illustrates an exemplary flow diagram for a process according to the invention.

DETAILED DESCRIPTION

The inventors have collected extensive MLSA data from several hundred large functional circuits (macros) of a microprocessor design, e.g., an IBM microprocessor design, averaging 30,000 transistors in size, and have found that static noise analysis spends 75% to 90% of its runtime in simulation, and 35% to 50% of this simulation runtime is spent on injected-noise simulations. Moreover, the inventors have found approximately 70% of the simulations for injected noise analysis is on sub-circuits receiving very low input noise and propagating even lower output noise. Analysis of this data has revealed that these simulation results can be adequately estimated, thereby avoiding costly simulation time while maintaining accuracy.

For the exemplary microprocessor design discussed above having, e.g., a Vdd=1.2 V, a distribution of node level (total) noise can be determined. The exemplary microprocessor design can include up to 900,000 internal nets. Any net found with a total noise level above, e.g., 300 mV can be considered a noise failure, while nets having total noise levels between 0 and 100 mV, and preferably between 0 and 60 mV, are acceptable.

The exemplary process utilizes a classification of the various macros or circuits in the microprocessor design under test, as described below. In this regard, these circuits can be classified into several, e.g., four, groups. By way of example, Group I can include circuits that tend to be the most sensitive of digital circuits to noise, such as low Vt devices, domino circuits, pass gates with multiple power supplies, and circuits with primary inputs on the current stage or next stage to ensure accuracy of noise abstracts, models of the noise tolerance of the primary inputs to the larger parent circuit, for use at a higher level of the design hierarchy. Group II can include latches, pass gates, and transfer gates. Group III can include circuits with p/n=1 for double inverter feedback paths—register bits that can be written into from the input or output. Group IV can include all remaining circuits.

The invention is directed to a method to improve the runtime of static noise analysis by replacing simulations of easily predictable circuit responses with estimates based on input noise voltages that would otherwise be simulated. The FIGURE illustrates a flow diagram 100 of an exemplary embodiment of the invention by which circuits for simulation replacement are selected based upon criteria for accepting or rejecting the estimated results. At step 101, the noise analysis process, e.g., a macro level signal analysis (MLSA), can begin. A determination is made at step 102 whether a skip injected noise simulation is enabled. The skip injected noise simulation is a user defined specification to identify certain circuit types for simulation. If the user requests simulation through this switch, the skip injected noise simulation is disabled for this evaluation node and the process proceeds to step 103 to simulate regular flow, and then to step 104 to propagate regular flow.

When the skip injected noise simulation is enabled, a determination is made at step 105, whether the circuit is a Group I circuit. Because these circuits are more sensitive to noise, when these circuits are present, the process proceeds to step 103 to simulate regular flow, and then to step 104 to propagate regular flow. When the circuit is not a Group I circuit, a determination is made at step 106, whether the circuit is a double inverter feedback circuit, i.e., whether the circuit is a Group III circuit. These circuits tend to propagate the input noise to the output without attenuation. For these circuits, the estimated output is not scaled and the output threshold is raised to allow default amplitude of noise to propagate through the circuit.

If the circuit is a double inverter feedback circuit (Group III circuit), the threshold values are established for the individual input threshold, the total noise threshold, and the output noise threshold at step 108. The specific threshold values are a function of the technology. In the exemplary embodiment, the threshold values in step 108 (as well as in steps 109 and 110 discussed below) may be based upon a value E, which can be a percentage, e.g., 12% of the power supply. This is also the amplitude of the default noise pulse used in MLSA (i.e., 12% of 1.2 V=144 mV). Moreover, a scaling factor D, e.g., ⅓, which can be statistically determined and vary according to the technology, can also be used in the output signal estimation, and can be used to reflect the attenuation expected from different standard types of CMOS circuits.

In establishing the predetermined thresholds in step 108, the predetermined individual input threshold can be, e.g., 1.5*E or 216 mV, the predetermined total noise threshold can be, e.g., 2*E or 288 mV, the predetermined output noise threshold can be, e.g., E or 144 mV, and the output is not scaled. At step 111, a determination is made whether the injected noise on each input is less than the predetermined individual input threshold as established in step 108 and whether the total noise on each input is less than the predetermined total noise input threshold as established in step 108.

When the circuit is not a double inverter feedback, the process proceeds to step 107 to determine whether the circuit is a latch, pass gate or transfer gate, i.e., a Group II circuit. As these are circuits to be considered carefully, the thresholds are lowered. If the circuit is a latch, pass gate or transfer gate (Group II circuit), the threshold values are established for the individual input threshold, the total noise threshold; and the output noise threshold at step 109. As noted above, the specific threshold values are a function of the technology, and in the exemplary embodiment, the threshold values in step 109 may also be based upon a value E, e.g., 12% of the power supply. This is also the amplitude of the default noise pulse used in MLSA (i.e., 12% of 1.2 V=144 mV). Moreover, the scaling factor D, e.g., ⅓, can also be used in the output signal estimation. In establishing the predetermined thresholds in step 109, the predetermined individual input threshold can be, e.g., E or 144 mV, the predetermined total noise threshold can be, e.g., E or 144 mV, the predetermined output noise threshold can be, e.g., 0.4*E or 57.6 mV, and the scale factor for the output can be, e.g., 2*D or ⅔. At step 111, a determination is made whether the injected noise on each input is less than the predetermined individual input threshold as established in step 109 and whether the total noise on each input is less than the predetermined total noise input threshold as established in step 109.

When the circuit is not a latch, pass gate or transfer gate (Group II circuit), the circuit is within the group of remaining circuits that have not been specifically identified, and the process proceeds to step 110 where the threshold values are established for the individual input threshold, the total noise threshold; and the output noise threshold. As noted above, the specific threshold values are a function of the technology, and in the exemplary embodiment, the threshold values in step 110 may also be based upon a value E, e.g., 12% of the power supply. This is also the amplitude of the default noise pulse used in MLSA (i.e., 12% of 1.2 V=144 mV). Moreover, the scaling factor D, e.g., ⅓, can also be used in the output signal estimation. In establishing the predetermined thresholds in step 110, the predetermined individual input threshold can be, e.g., 1.5*E or 216 mV, the predetermined total noise threshold can be, e.g., 2*E or 288 mV; the predetermined output noise threshold can be, e.g., 0.4*E or 57.6 mV, and the scale factor for the output can be, e.g., 1*D or ⅓. At step 111, a determination is made whether the injected noise on each input is less than the predetermined individual input threshold as established in step 110 and whether the total noise on each input is less than the predetermined total noise input threshold as established in step 110.

When the predetermined individual injected noise threshold is compared to the magnitude of injected noise on individual inputs, and the value of injected noise is found to be small enough, that output noise can be safely estimated without loss in accuracy. Further, when the predetermined total noise threshold is compared to the magnitude of total noise on the input, and the value of the summation of noise on all the inputs is found to be small enough, output noise can also be estimated safely, without loss in accuracy. Therefore, when the injected noise on each input is not less than the predetermined individual input threshold as established in steps 108, 109, or 110 or when the total noise on each input is not less than the predetermined total noise input threshold as established in step 108, 109, or 110, the process proceeds to step 103 to simulate regular flow, and then to step 104 to propagate regular flow.

Conversely, when the injected noise on each input is less than the predetermined individual input threshold as established in steps 108, 109, or 110 and the total noise on each input is less than the predetermined total noise input threshold as established in step 108, 109, or 110, the process proceeds to step 112 to estimate the output noise. The output noise can be estimated with a noise wave generated or created using the following data from the input noise waves: a) the dc component of the output wave can equal the sum of the dc components of the input waves; b) the ac amplitude of the output wave can equal the maximum or largest input amplitude, which is scaled based on the output load; and c) the shape of the wave can equal the shape of default noise waves, e.g., used in MLSA, which can include a dc value, followed by ramp, followed by an exponential decay.

After output noise has been estimated, the generated noise wave may be multiplied in step 113 by an applicable scaling factor that was established in step 108, 109, or 110. In this way, the generated wave either remains the same (when there is no scaling factor) or is scaled down by an appropriate scaling factor for the circuit type. In step 114, a determination can be made whether the estimated output noise is less than the output noise threshold. The output noise threshold can be compared to the magnitude of noise on the output. Since slightly different output signal estimation algorithms may be used for the different circuit types, the output noise threshold serves as a confirmation that the noise is really small enough to propagate without simulation. Therefore, if the estimated output noise is less than the output noise threshold, the estimated output noise is small enough to propagate and the process proceeds to step 104 to propagate regular flow, otherwise, the process proceeds to step 103 to simulate regular flow, and then to step 104 to propagate regular flow.

Thus, the process of the invention determines whether to use the estimated noise value on the output and, therefore, skip simulation. As set forth above, the determination is based on individual input threshold (noise-injected), total input noise threshold, and output threshold.

In summary, the basic injected noise test procedure for each sub-circuit of a larger circuit generally considers the following conditions:

1) whether the input noise is small enough to estimate instead of simulating, i.e., whether the input noise is smaller than a statistically predetermined threshold. If the input noise is larger than the predetermined threshold, the sub-circuit will need to undergo complete simulation. The magnitude of the noise can be determined by an amplitude of a noise voltage waveform, which is the maximum deviation of the voltage of the signal from the normal stable value.
2) whether the sub-circuit is in one of the certain predetermined noise-sensitive circuit type that needs a full simulation to be executed for the sub-circuit.
3) when the noise is lower than the predetermined threshold, and when the sub-circuit is not one of the noise-sensitive types, output noise can be estimated and a noise wave of the estimated value can be propagated to a next stage.

This noise analysis method according to the invention can save a significant amount of time that previously was spent simulating extremely small noise situations. Thus, the advantage of this invention provides an almost 1.4-2 times improvement in run time of many large circuits with almost no loss in accuracy.

According to embodiments, the invention can take the form of an entirely software embodiment, an entirely hardware embodiment or an embodiment containing both hardware and software elements. In a preferred embodiment, the invention is implemented in software, which includes but is not limited to firmware, resident software, microcode, etc.

Furthermore, the invention can take the form of a computer program product accessible from a computer-usable or computer-readable medium providing program code for use by or in connection with a computer or any instruction execution system. For the purposes of this description, a computer-usable or computer readable medium can be any apparatus that can contain, store, communicate, propagate, or transport the program for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed:

1. A method for improving performance of noise analysis using a threshold based combination of noise estimation and simulation, comprising:
    classifying a circuit into one of four defined noise response groups based on the circuit's type;
    determining if an input noise of the classified circuit is small enough to skip simulation;
    estimating an output noise wave of the classified circuit;
    scaling down the estimated output noise wave by a scaling factor corresponding to the one of the four defined noise response groups of the classified circuit; and
    determining if the scaled down estimated output noise wave of the classified circuit is small enough to propagate or instead requires simulation,
    wherein at least one of the classifying, the estimating, and the scaling down are performed using a computer device including a processor.

2. The method in accordance with claim 1, wherein the determining if an input noise is small enough to skip simulation comprises determining whether the input noise is smaller than a statistically predetermined threshold.

3. The method in accordance with claim 1, further comprising:
    determining a magnitude of the input noise by an amplitude of a noise voltage waveform; and
    comparing the magnitude of the input noise to a statistically predetermined threshold.

4. The method in accordance with claim 1, wherein the one of the four defined noise response groups includes predetermined noise-sensitive circuits, including:
 circuits with low threshold voltage (Vt) devices,
 domino circuits,
 pass gates with multiple power supplies, and
 circuits with primary inputs on a current stage or next stage to ensure accuracy of noise abstracts, models of noise tolerance of primary inputs to larger parent circuit, for use at a higher level of design hierarchy.

5. The method in accordance with claim 1, wherein the one of the four defined noise response groups includes double inverted feedback circuits.

6. The method in accordance with claim 1, wherein the one of the four defined noise response groups includes latches, pass gates, and transfer gates.

7. The method of claim 1, wherein the method is implemented in a computer infrastructure that improves performance of noise analysis using a threshold based combination of noise estimation and simulation.

8. A method implemented in a computer infrastructure having computer executable code tangibly embodied on computer readable storage memory with programming instructions for performing noise analysis on a circuit, comprising:
 determining whether input noise is smaller than a statistically predetermined threshold;
 determining whether the circuit is a predetermined noise-sensitive circuit; and
 when the input noise is smaller than the predetermined threshold and the circuit is not a predetermined noise-sensitive circuit, estimating an output noise for the circuit,
 wherein predetermined noise-sensitive circuits comprise:
  circuits with low threshold voltage (Vt) devices,
  domino circuits,
  pass gates with multiple power supplies, and
  circuits with primary inputs on a current stage or next stage to ensure accuracy of noise abstracts, models of noise tolerance of primary inputs to larger parent circuit, for use at a higher level of design hierarchy.

9. The method in accordance with claim 8, further comprising:
 simulating an output noise for the circuit when one of:
 the input noise is greater than the predetermined threshold, and
 the circuit is a predetermined type of noise-sensitive circuit.

10. The method in accordance with claim 8, wherein the input noise comprises total input noise and injected input noise.

11. The method in accordance with claim 8, further comprising multiplying the estimated output noise by a scaling factor associated with a type of the circuit.

12. The method in accordance with claim 11, further comprising determining whether the scaled estimated output noise is less than an output noise threshold.

13. The method in accordance with claim 8, wherein the circuit comprises a sub-circuit of a larger circuit composed of a plurality of sub-circuits.

14. An apparatus for determining whether to estimate or simulate noise for a circuit under test, comprising:
 a device for determining whether the circuit under test is of a type that is sensitive in the presence of noise by classifying the circuit under test into a noise response group, the noise response group being one of a plurality of defined noise response groups having at least one of a respective total input noise threshold and a respective injected input noise threshold;
 a device for comparing at least one of a total input noise and an injected input noise to a respective one of the total input noise threshold and the injected input noise threshold of the noise response group in which the circuit under test is classified; and
 a device for comparing an estimated output noise to an output noise threshold,
 wherein, when the estimated output noise is lower than the output noise threshold, a device for estimating output noise is activatable, and
 wherein the apparatus comprises a computer including a processor.

15. The apparatus in accordance with claim 14, further comprising a device for simulating the output noise that is activatable when the estimated output noise is greater than the output noise threshold, simulating the output noise.

16. The apparatus in accordance with claim 14, further comprising a device for simulating the output noise that is activatable at least one of when the total input noise is greater than the total input noise threshold and when the injected input noise is greater than the injected input noise threshold.

17. The apparatus in accordance with claim 14, further comprising a device for simulating the output noise that is activatable when the circuit under test is determined to be of a predetermined noise sensitive type that does not function in the presence of noise.

18. The apparatus in accordance with claim 14, further comprising a scaling device for scaling the estimated output noise in accordance with a circuit type of the circuit under test.

19. The apparatus in accordance with claim 14, wherein the defined noise response groups comprise at least one of:
 circuits that tend to be most sensitive of digital circuits to noise;
 specified latches and gates;
 register bits that can be written into from input or output; and
 all remaining circuits.

20. The apparatus in accordance with claim 19, wherein:
 the circuits that tend to be most sensitive of digital circuits to noise comprise at least low threshold voltage (Vt) devices, domino circuits, pass gates with multiple power supplies, and circuits with primary inputs on a current stage or next stage; and
 the specified gates include pass gates and transfer gates.

21. An apparatus for determining whether to estimate or simulate noise for a circuit under test, comprising:
 a device for determining whether the circuit under test is of a type that is sensitive in the presence of noise;
 a device for comparing at least one of a total input noise and an injected input noise to a respective at least one of a total input noise threshold and an injected input noise threshold;
 a device for comparing an estimated output noise to an output noise threshold; and
 a device for determining whether the circuit under test comprises double inverter feedback,
 wherein, when the estimated output noise is lower than the output noise threshold, a device for estimating output noise is activatable, and
 wherein the apparatus comprises a computer including a processor.

22. An apparatus for determining whether to estimate or simulate noise for a circuit under test, comprising:

a device for determining whether the circuit under test is of a type that is sensitive in the presence of noise;

a device for comparing at least one of a total input noise and an injected input noise to a respective at least one of a total input noise threshold and an injected input noise threshold;

a device for comparing an estimated output noise to an output noise threshold; and a device for determining whether the circuit under test is one of a latch, pass, or transfer gate, wherein, when the estimated output noise is lower than the output noise threshold, a device for estimating output noise is activatable, and wherein the apparatus comprises a computer including a processor.

* * * * *